Figure 1:
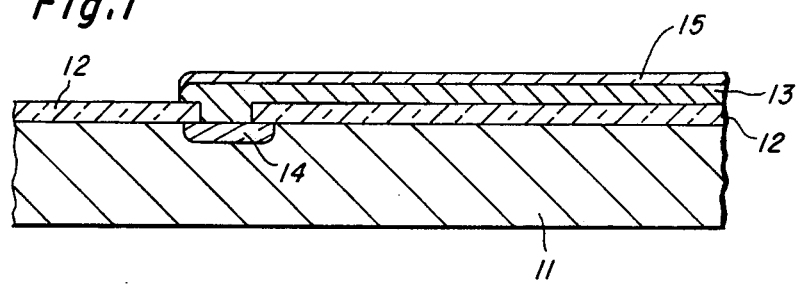

United States Patent [19]
Hooper et al.

[11] 4,182,781
[45] Jan. 8, 1980

[54] LOW COST METHOD FOR FORMING ELEVATED METAL BUMPS ON INTEGRATED CIRCUIT BODIES EMPLOYING AN ALUMINUM/PALLADIUM METALLIZATION BASE FOR ELECTROLESS PLATING

[75] Inventors: Robert C. Hooper, Houston; Alexander J. Harrover, Missouri City; Michael J. VanHoy, Stafford; Charles E. Terry, Houston, all of Tex.

[73] Assignee: Texas Instruments Incorporated, Dallas, Tex.

[21] Appl. No.: 835,385

[22] Filed: Sep. 21, 1977

[51] Int. Cl.² ............................................. C23C 3/02
[52] U.S. Cl. ..................................... 427/90; 156/644;
 156/656; 156/664; 156/665; 156/657; 204/15;
 427/91; 427/92; 427/93; 427/94; 427/98;
 427/259; 430/314
[58] Field of Search ............... 427/90, 91, 92, 96,
 427/98, 259, 93, 94; 204/15; 96/36.2; 156/644,
 656, 664, 665, 657

[56] References Cited
U.S. PATENT DOCUMENTS

| | | | |
|---|---|---|---|
| 3,239,376 | 3/1966 | Schmidt | 427/90 |
| 3,453,501 | 7/1969 | Dunkle | 427/92 |
| 3,579,375 | 5/1971 | Wonilowicz | 427/92 |
| 3,597,834 | 8/1971 | Lathrop | 427/92 |
| 3,623,961 | 11/1971 | Van Laer | 204/15 |
| 3,663,184 | 5/1972 | Wood | 428/672 |
| 3,669,734 | 6/1972 | Jacob et al. | 427/92 |
| 4,005,472 | 1/1977 | Harris | 427/92 |
| 4,122,215 | 10/1978 | Vratny | 427/92 |

*Primary Examiner*—John D. Smith
*Attorney, Agent, or Firm*—James T. Comfort; Rene' E. Grossman; Gary C. Honeycutt

[57] ABSTRACT

Elevated metal contact bumps are provided on a microelectronic semiconductor circuit, with the use of aluminum-palladium metallization as a base for selective electroless plating. The aluminum and palladium are preferably deposited sequentially in a single operation, i.e., without exposing the aluminum surface to the atmosphere. The aluminum-palladium film is then patterned in a single step, using an etchant which attacks both metals at substantially the same rate. The metal pattern is then covered with an insulation layer wherein apertures are opened to expose palladium at selected sites for immersion in an electroless plating bath of ionic Cu or Ni for bump formation.

7 Claims, 3 Drawing Figures

LOW COST METHOD FOR FORMING ELEVATED METAL BUMPS ON INTEGRATED CIRCUIT BODIES EMPLOYING AN ALUMINUM/PALLADIUM METALLIZATION BASE FOR ELECTROLESS PLATING

This application relates to microelectronic semiconductor circuits, and more particularly to the formation of elevated metal contacts ("bumps") for such circuits. A process for the fabrication of contact bumps is provided, using aluminum-palladium metallization as a base for slective electroless plating.

In the manufacture of integrated circuits, several techniques have evolved for providing electrical contact to the bonding pads of the circuit. One approach involves the fabrication of elevated metal contact bumps on the bonding pads in order to facilitate various mechanized assembly processes such as the flip-chip bonding, and other bonding techniques for the attachment of lead frames to a circuit chip.

In fabrication of elevated metal bump contacts, it has previously been recognized that a metal barrier layer is required between the bump contact and the underlying aluminum metallization. See, for example, U.S. Pat. Nos. 3,623,961, issued Nov. 30, 1971, to van Laer and 3,663,184 issued May 16, 1972, to Wood et al. The van Laer process begins with a sequential deposition of aluminum and nickel, followed by a selective patterning of the nickel, then by bump formation, and finally, the aluminum is patterned using the nickel layer as a mask.

In accordance with the present invention, several improvements with respect to the prior art, including van Leer, are achieved. Elevated metal contact bumps are provided on a microelectronic semiconductor circuit, with the use of aluminum-palladium metallization as a base for selective electroless plating. The aluminum and palladium are preferably deposited sequentially in a single operation, i.e., without exposing the aluminum surface to the atmosphere. The aluminum-palladium film is then patterned in a single step, using an etchant which attacks both metals at substantially the same rate. The metal pattern is then covered with an insulation layer having apertures therein to expose palladium at selected sites for immersion in an electroless plating bath of ionic copper or nickel for bump formation.

In one embodiment of the invention a method for the metallization of a semiconductor integrated circuit is provided, beginning with the step of forming an insulation layer on the semiconductor, said insulation layer having apertures at locations selected for ohmic contact to the semiconductor surface. A thin film of aluminum and a thin film of palladium are then sequentially deposited on the insulation layer and in said apertures. Both the aluminum and palladium films are then patterned by selective etching with an etchant that attacks both metals. The resulting pattern is then covered with a second layer of insulation, and the second layer is provided with apertures which selectively expose palladium at locations where metal bumps are desired. The exposed palladium is then immersed in a suitable plating bath for the formation of nickel or copper bumps.

Figure 2:
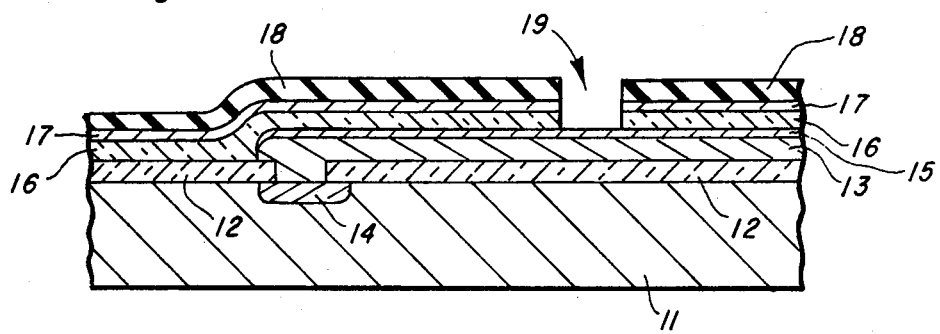
Figure 3:
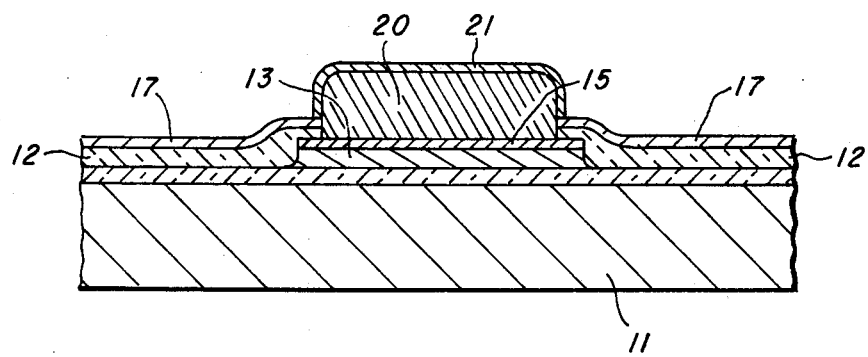

FIGS. 1-3 are enlarged cross sectional views of a semiconductor wafer, illustrating a sequence of process steps used in fabricating the elevated metal contacts of the invention.

As shown in FIG. 1, silicon substrate 11 is provided with a first insulation layer 12 having apertures therein for exposing device areas 14 to which ohmic contact is desired. A metallization layer comprising aluminum film 13 and palladium film 15 is deposited and patterned on layer 12 in accordance with known processes. Also, a selective etchant solution of nitric, acetic, and phosphoric acids has been found suitable for patterning palladium and aluminum.

As shown in FIG. 2, the structure of FIG. 1 is then covered with a second insulation layer comprising silicon oxide film 16 and silicon nitride film 17. Typically, these materials are deposited by plasma-assisted chemical vapor deposition. For example, oxide layer 16 is about 7000 angstroms thick to provide mechanical protection for the circuit, while nitride layer 17 is about 3000 angstroms thick to provide the chip with a hermetic seal.

Photoresist layer 18 is then deposited and patterned to provide apertures 19 at locations where elevated metal bump contacts are desired. Using resist layer 18 as a mask, apertures 19 are extended through nitride layer 17 and oxide layer 16 to expose palladium layer 15. The wafer is then immersed in an aqueous electroless plating bath containing, for example, a 2.0% concentration of nickel sulfate and 1.0% $NaH_2PO_2$, at a PH of 4-5, adjusted with sulphuric acid and a suitable base such as $NH_4OH$. After 60 minutes immersion at a temperature of 160°-190° F., a nickel bump of about 1/2 mil in height is achieved. In the alternative, a Cu bump may be plated with the use of a similar bath.

As shown in FIG. 3, the area of bump formation includes nickel bump 20, palladium film 15, oxide film 12 and silicon substrate 11. The surrounding surface is sealed and passivated by oxide 16 and nitride 17. The bump may then be protected by a final gold layer 21, also applied by electroless plating.

The discovery of palladium as a unique barrier metal in bump metallization systems has sharply increased the yields and reliability of integrated circuit devices designed for "gang-bonding" or "flip-chip" mounting. The cost savings are also quite substantial, since the invention permits both the aluminum and the barrier to be deposited and patterned together, as a single operation, thereby reducing the overall number of fabrication steps. The palladium is compatible with aluminum and with the subsequently deposited insulation film, in that it adheres well to both, and has a thermal coefficient of expansion that is sufficiently close to aluminum that no significant stress problems result. Palladium is also far superior as a surface for electroless plating, compared to nickel, and therefore permits additional savings compared to electroplating, which is a time-consuming and expensive process.

What is claimed is:

1. A method for the metallization of a semiconductor integrated circuit, comprising the steps of:
    (a) forming an insulation layer on the semiconductor, said layer having apertures at locations for ohmic contact to said semiconductor;
    (b) sequentially depositing a thin film of aluminum and a thin film of palladium on said layer and in said apertures;
    (c) patterning both said films; in a single step
    (d) covering the resulting pattern with a second layer of insulation, and patterning to provide said second layer apertures which selectively expose palladium at locations on said pattern where metal bumps are desired; then (e) plating the exposed palladium with a suitable metal for bump formation, by electroless plating and continuing the plating until a bump of sufficient height is formed.

2. A method is in claim 1 wherein said semiconductor is silicon, and said first insulation layer is silicon oxide.

3. A method is in claim 1 wherein said step of patterning the aluminum-palladium film includes selectively etching with acetic, phosphoric and nitric acids.

4. A method as in claim 1 wherein said second layer of insulation is formed by plasma-assisted chemical vapor deposition of $SiO_2$ and $SI_3N_4$.

5. A method as in claim 1 wherein said plating step includes immersion of the exposed palladium in an electroless plating bath of an ionic Ni or Cu compound.

6. A method as in claim 1 further including the step of coating the resulting bump with a layer of gold.

7. A method as in claim 1 wherein the resist pattern used for forming apertures in the second layer of insulation is left in place during the subsequent plating step to form metal bumps.

* * * * *